United States Patent
Rapp

(10) Patent No.: US 7,626,817 B2
(45) Date of Patent: Dec. 1, 2009

(54) 3 DIMENSIONAL LAYERED FLEX CIRCUIT ELECTRONIC ASSEMBLY DESIGNED TO MAXIMIZE THE COOLING OF ELECTRONICS THAT ARE CONTAINED WITHIN THE ASSEMBLY SUCH THAT THE COMPONENT DENSITY WITHIN SAID ELECTRONIC ASSEMBLY CAN BE MAXIMIZED

(76) Inventor: Robert J Rapp, 23333 Ridge Route #126, Lake Forest, CA (US) 92630

( * ) Notice: Subject to any disclaimer, the term of this patent is extended or adjusted under 35 U.S.C. 154(b) by 379 days.

(21) Appl. No.: 11/440,945

(22) Filed: May 25, 2006

(65) Prior Publication Data

US 2006/0273814 A1 Dec. 7, 2006

Related U.S. Application Data

(60) Provisional application No. 60/686,289, filed on Jun. 1, 2005.

(51) Int. Cl.
*H05K 7/20* (2006.01)
(52) U.S. Cl. ...................................... 361/688
(58) Field of Classification Search ......... 361/687–691, 361/679, 679.53
See application file for complete search history.

(56) References Cited

U.S. PATENT DOCUMENTS 4,833,567 A * 5/1989 Saaski et al. ................ 361/700
5,260,850 A * 11/1993 Sherwood et al. ........... 361/689
2005/0275589 A1* 12/2005 Wilson ................ 343/700 MS

* cited by examiner

Primary Examiner—Javaid Nasri

(57) ABSTRACT

A 3 dimensional electronic assembly comprised of a series or plurality of electronic Flex circuit sub-assemblies that form a layered Flex circuit assembly. Each Flex circuit sub-assembly is electronically connected to one or more other Flex circuits forming a multi-layer electronic Flex circuit assembly where various layers are separated by a substance that is designed to transfer heat away from the electronic components with the intent of cooling the electronic devices contained within the assembly. Each said Flex circuit sub-assembly/layer contains one or more trace layers for the conduction of electronic signals, power, and ground. Each Flex circuit layer may also contain electronic components such that the overall device forms an electronic assembly with embedded electronic components. A layered Flex circuit assembly will contain at least two Flex circuit sub-assemblies to which electronic components are electrically attached forming a 3 dimensional electronic assembly. 3 dimensional electronic assemblies may be assembled within an external package. Various forms of heat transfer are used to cool the electronic devices contained within the assembly. Heat transfer mechanisms include directed air flow, embedded heat sinks, heat conduction through a liquid, embedded heat pipes, and an enclosure that is designed to operate as a heat pipe.

4 Claims, 7 Drawing Sheets

Layered Flex Circuit
Electronic Assembly, Top View & Side
View including heat conductive pads &
Embedded Heat Pipes

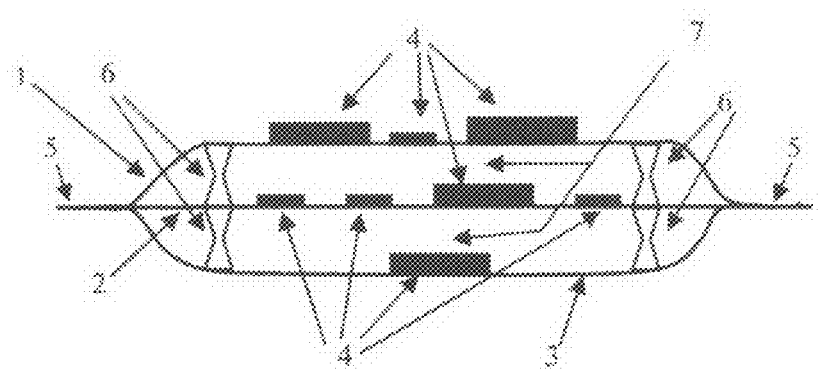
Figure 1A: Layered Flex Circuit
Electronic Assembly, Side View
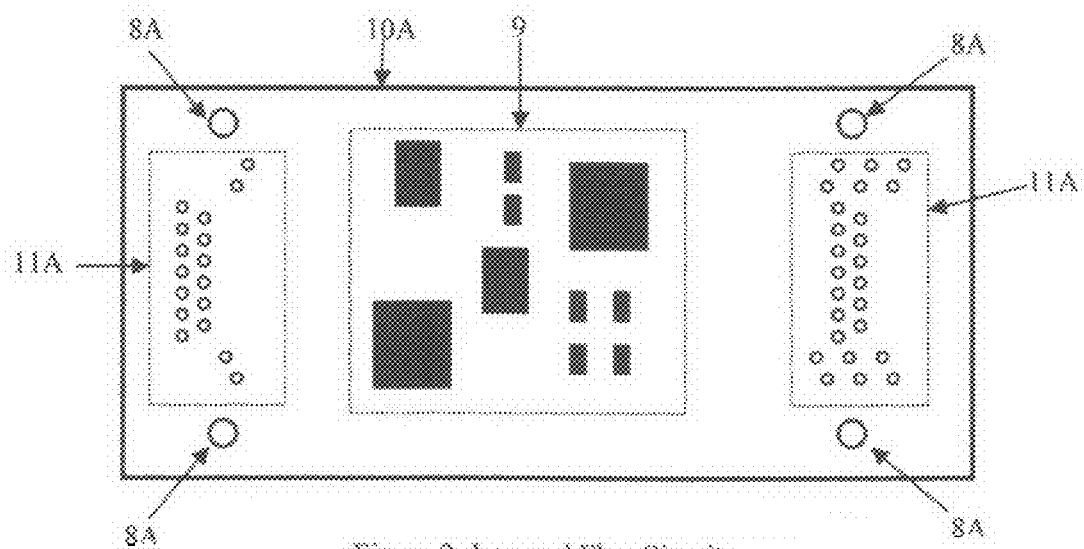
Figure 2: Layered Flex Circuit
Electronic Sub-Assembly Top View

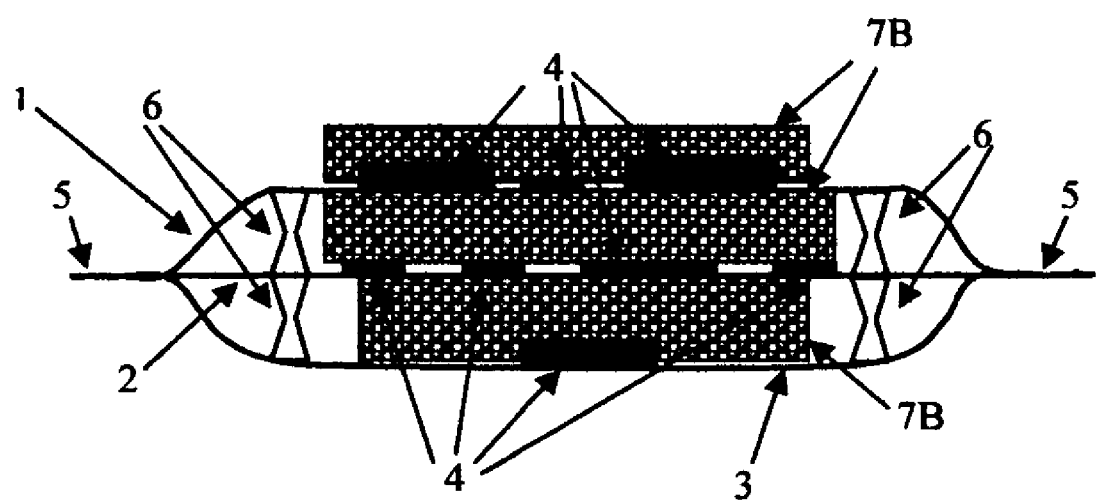
Figure 1B: Layered Flex Circuit Electronic Assembly, Side View including heat conductive pads

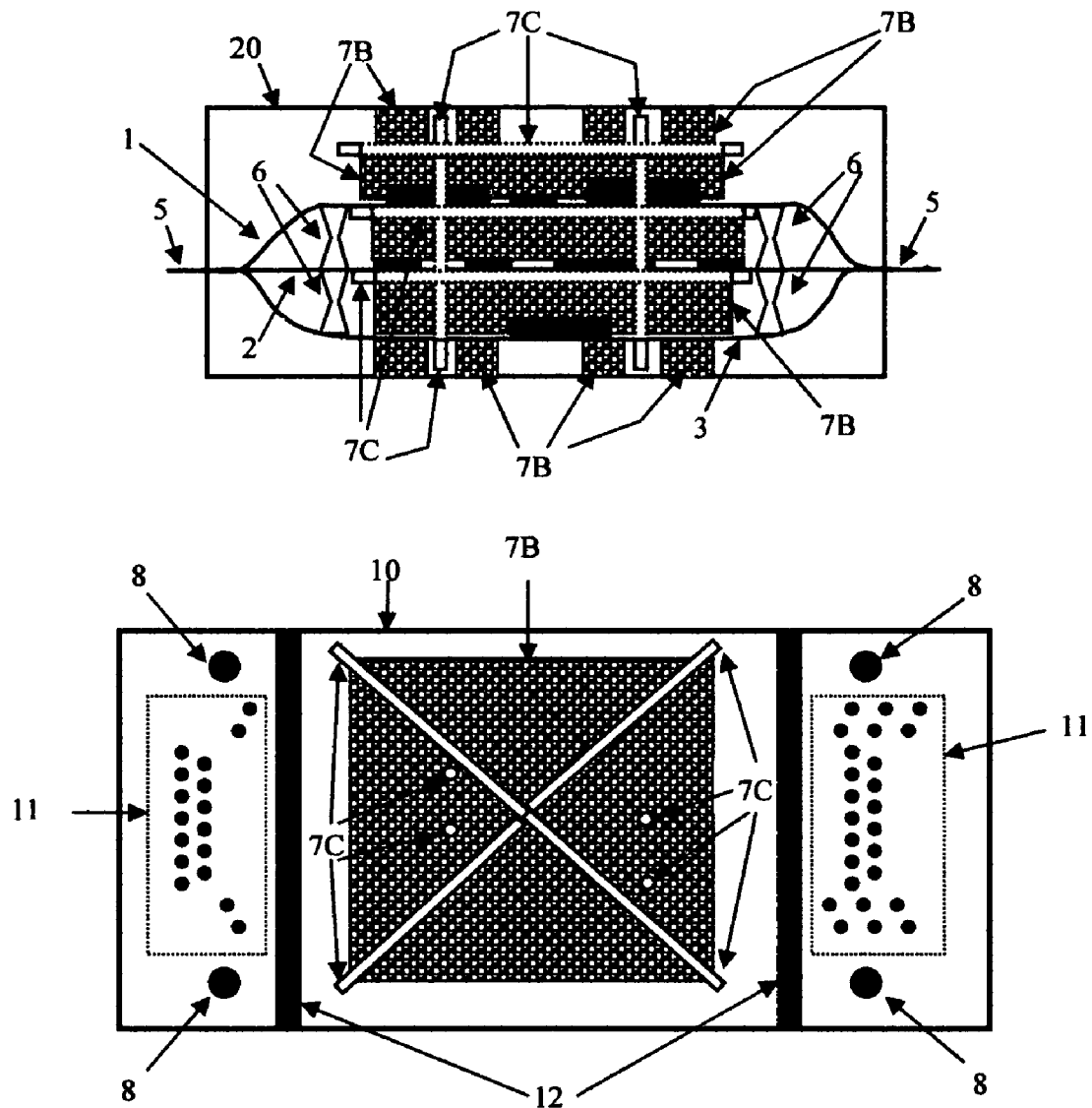
Figure 1C: Layered Flex Circuit Electronic Assembly, Top View & Side View including heat conductive pads & Embedded Heat Pipes

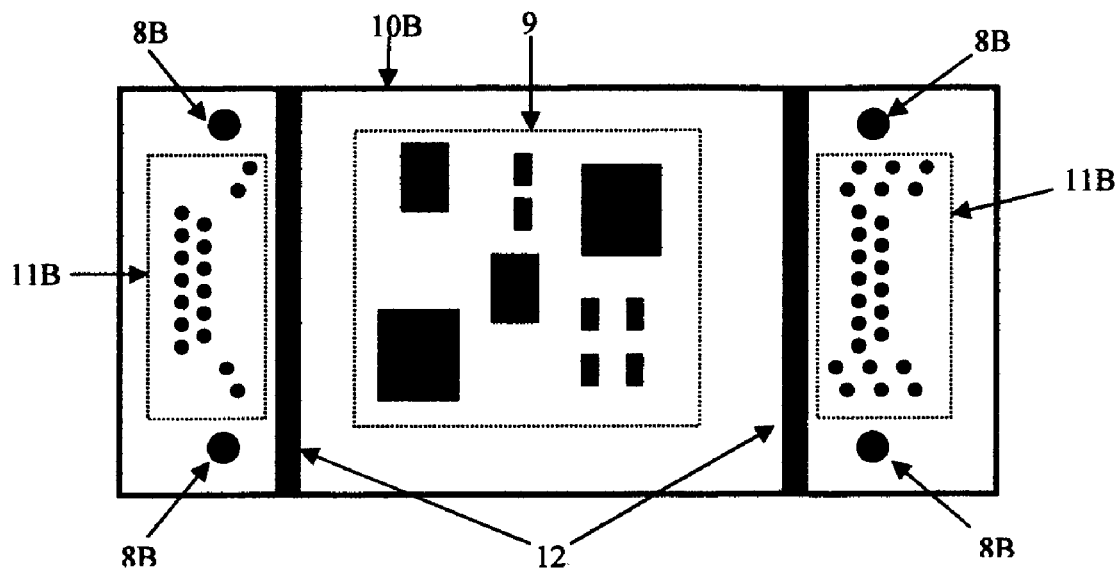
Figure 3: Layered Flex Circuit
Electronic Assembly Top View
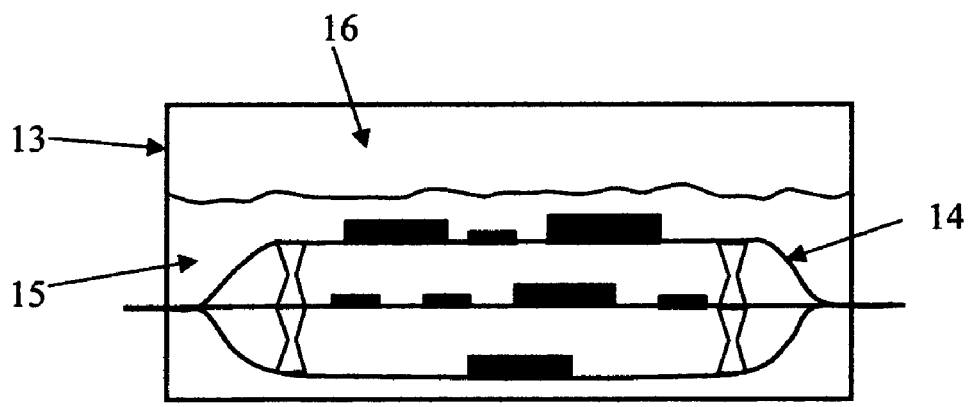
Figure 4: Layered Flex Circuit Electronic
Assembly Packaged in a Case that is
Designed to Operate as a Liquid Phase to
Gas Phase Heat Pipe

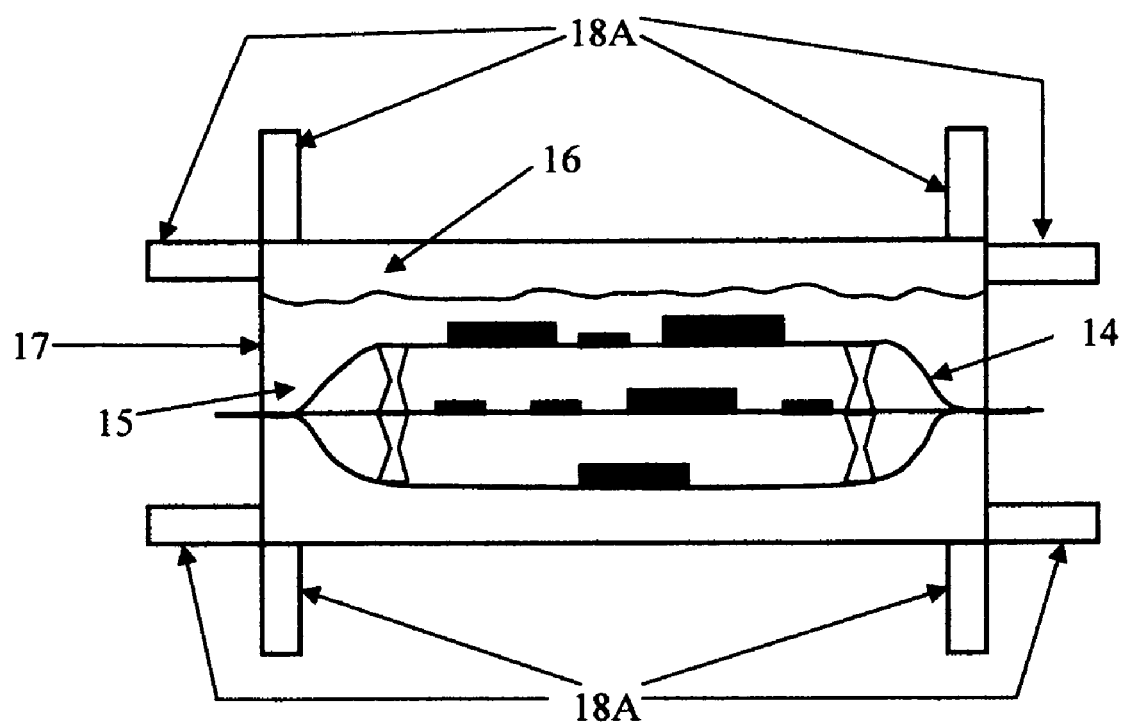
Figure 5A: Layered Flex Circuit Electronic Assembly Packaged in a first Case that is Designed to Operate as a Liquid Phase to Gas Phase Heat Pipe in any Orientation

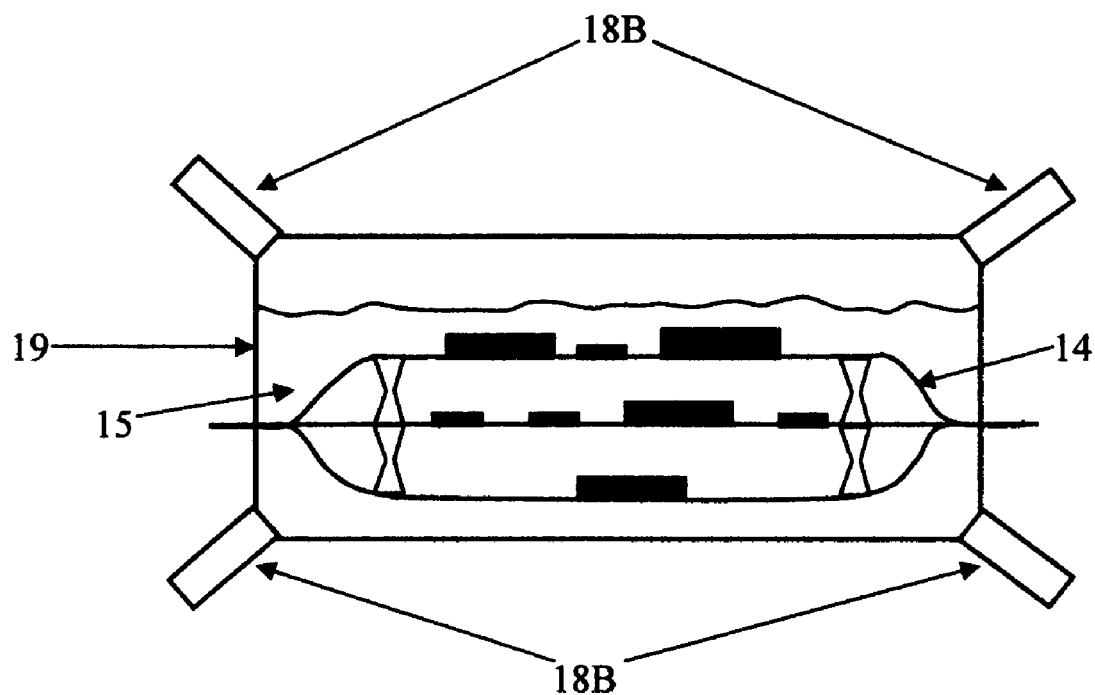
Figure 5B: Layered Flex Circuit Electronic Assembly Packaged in a second Case; that is Designed to Operate as a Liquid Phase to Gas Phase Heat Pipe in any Orientation

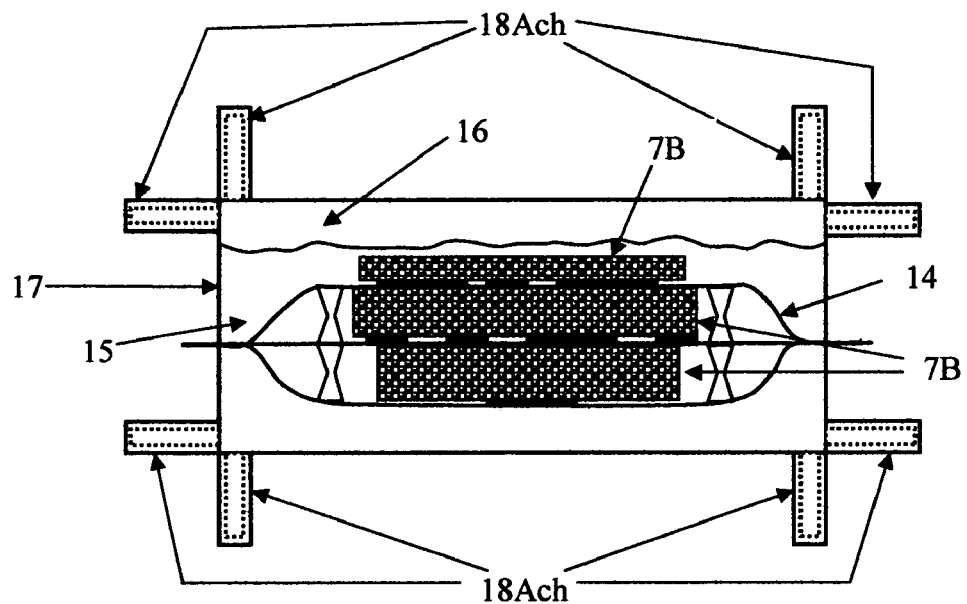
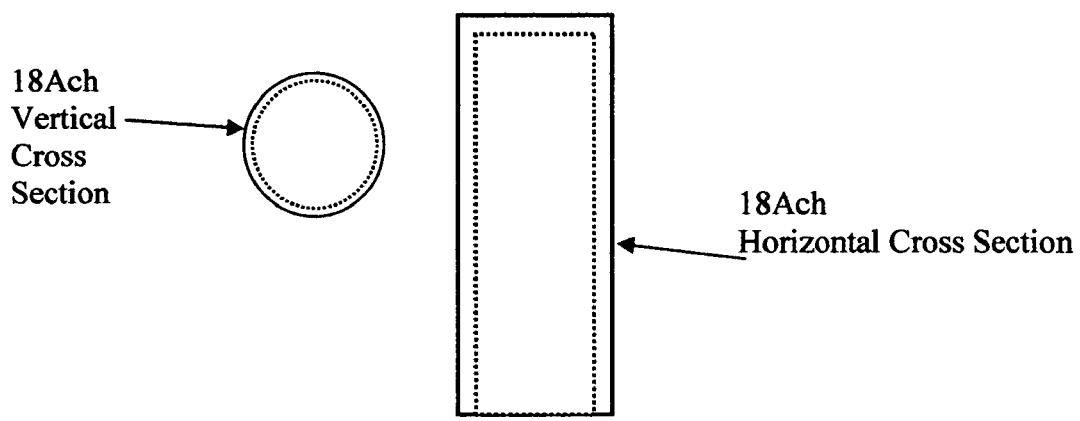
Figure 5C: Layered Flex Circuit Electronic Assembly Packaged in a first Case that is Designed to Operate as a Liquid Phase to Gas Phase Heat Pipe in any Orientation; Chambers within Towers shown in Cross Section ID LAYERED FLEX CIRCUIT
ELECTRONIC ASSEMBLY DESIGNED TO
MAXIMIZE THE COOLING OF
ELECTRONICS THAT ARE CONTAINED
WITHIN THE ASSEMBLY SUCH THAT THE
COMPONENT DENSITY WITHIN SAID
ELECTRONIC ASSEMBLY CAN BE
MAXIMIZED

CROSS REFERENCE TO RELATED
APPLICATIONS

This application is entitled to the benefit of Provisional Patent application No. 60/686,289 filed Jun. 1, 2005.

FEDERAL RESEARCH STATEMENT

Not Applicable, this invention was developed without government assistance.

A 3 dimensional layered flex circuit electronic assembly designed to maximize the cooling of electronics that are contained within the assembly such that the component density within said electronic assembly can be maximized.

BACKGROUND OF THE INVENTION

Flexible circuits commonly called Flex circuits consist of metallic circuit traces that are built onto Mylar through a photo imaging & etching process onto which electronic components are frequently mounted or attached. Usually, to minimize cost and enhance flexibility Flex circuits are built with one or two trace layers that contain electrically conductive metallic traces. Furthermore the metallic traces are usually encapsulated in Mylar that acts as a solder mask in order to minimize shorting from external contamination. Furthermore exposed metallic contacts, vias or through holes are usually plated with solder such that exposed metallic surfaces resist corrosion.

NOTE: In this document the terms "trace layer" and "trace layers" are used to identify a single flexible circuit that contains a number of independent signal carrying metallic layers that are encapsulated together as a single unit: These terms are used to describe conventional flexible circuits.

Flex circuits can also be built with more than two trace layers, in ways that are similar to how multiple layer circuit boards are constructed. Building Flex circuits that contain more than two trace layers is less flexible and more expensive than Flex circuits that contain one or two trace layers as each added trace layer increases the rigidity of the Flex circuit. A defect in any trace layer of a multiple trace layers Flex circuit may cause the entire Flex circuit to be scrapped.

Flexible circuits are also built into sheets. Sometimes these sheets are designed to be folded after electronic components are attached to the flex circuit. This folding of Flex circuits impose significant limitations on designers, however, these limitations include: 1. A single defect in a sheet can cause the entire sheet of Flex circuit to be scraped: 2. Trace lengths increase as the size of the sheet increases: 3. The more layers contained within folded Flex circuits increases stiffness of the Flex circuit, making it more difficult to fold, while increasing the likelihood that traces contained within will crack, or that the Flex circuit will contain defect defects from the manufacture of the raw flex circuit itself: 4. Folded Flex circuits will trap heat as Mylar is a thermal insulator, heat is the enemy of electronic components.

Since Flex circuits are excellent thermal insulators any 3 dimensional electronic assembly built using conventional techniques will not keep electronic components cool as heat will not be transferred away from the component readily.

If however distinct separate Flexible circuits are built using a series of small sheets to which electronic components are attached, soldered, or bonded; and then then assembled into a multiple layer Flex circuit with embedded components and designed to transfer heat many of the limitations of using Flex circuits can be overcome. Thus the invention described within is designed to overcome the limitations of conventional Flex circuits in unique non-obvious ways.

Other consideration are 3 dimensional electronic circuits that are built by stacking a plurality of electronic devices, sometimes various layers of electronic devices are wire bonded together, or may be built by soldering electronic components or die directly to each other. The electrical interconnections in these types of three dimensional electronic circuits are stressed and can crack when exposed to changing temperature or thermal cycling. Furthermore these structures are not designed to efficiently transfer heat away from the electronic components contained within the assembly.

Thus invention described within this document is an electronic assembly that uses multiple flexible circuits that are assembled into unique configurations with unique attributes that resolve shortcomings of conventional Flex circuit and conventional 3 dimensional electronic assemblies.

Such a device includes: a plurality of flexible circuits with electronic components attached, where each flexible circuit is separated by substances that are designed to transfer heat away from electronic components that are located between different flexible circuits forming a "multi-layer" 3 dimensional "layered Flex circuit assembly" from a plurality of "Flex circuit sub-assemblies". Thus the invention describe within is substantially different from conventional Flex circuits.

Substances that may be used to transfer heat include: heat sinks made of metal or carbon: heat conductive pads that fill voids and make heat sinks more efficient: phase change materials: conduction of heat through a gas: forced air blowing over a hot spot: flowing of a chilled fluid: conduction of heat through a liquid: and heat pipes where a fluid evaporates into a gas at a hot location carrying heat away to a cooler location.

Furthermore approaches that embed electronic components between layers of flex circuits without a means for moving heat from said embedded components in an efficient way may fail because of high temperature.

Yet the use of layers of flex circuits where various layers are separated by a distance with heat transfer mechanisms built into a 3 dimensional assembly that can efficiently move heat away from embedded components such that their useful life can be maximized is new. Furthermore since each Flex circuit sub-assembly is attached at certain points and the different layers are free to float relative to each other, stresses components are not subjected to mechanical stresses from induced by other layers or from thermal expansion and contraction.

A non-obvious benefit of such a layered Flex circuit assembly where components are soldered onto flex circuits and assembled within a liquid filled enclosure or heat pipe is that the electronic assembly itself can be soldered in an oven to a circuit board without melting the solder that attaches the electronic components to the Flex circuit sub-assemblies; as the liquid in such a case prevents the temperature inside the enclosure from rising quickly.

BRIEF DESCRIPTION OF THE DRAWINGS

FIG. 1A shows the side view of a layered Flex circuit electronic circuit assembly that has 3 layers of Flex circuit sub-assemblies that are numbered (1, 2, & 3), each Flex circuit sub-assembly layer contains a plurality of electronic components (4) that are attached to a Flex circuit. The Flex circuit sub-assemblies are interconnected into a layered electronic Flex circuit assembly through electrical an mechanical connections (5) at their ends. Non-rigid spacers (6) may be used between the layers to compliantly support the each layer of the electronic assembly. Areas between the Flex circuit sub-assembly layers (7A) are spaces or gaps where heat sinking substances such as heat sinks, liquids, or gasses will be introduced. This is one possible configuration.

FIG. 1B shows the same layered Flex circuit electronic assembly shown in FIG. 1A and same items (1, 2, 3, 4, 5, & 6) yet includes heat conductive pads (7B) contacting electronic components on the Flex circuit sub-assembly, and filling space between one of the Flex circuit sub-assemblies and another.

FIG. 1C shows the same layered Flex circuit electronic assembly shown in FIGS. 1A and 1B, items 1-6 are the same items as depicted in FIGS. 1A and B; designators and arrows showing item number 4, the electronic components, have been removed in order to show other items more clearly. Items marked 7B are heat conductive pads, FIG. 1C, side view, shows additional heat conductive pads located between the electronic assembly and a case (20). Items 7C are a plurality of heat pipes embedded into the flex circuits; these heat pipes are shown in both the side view and top view of the electronic assembly. Other features shown are item 8 alignment holes, used to align Flex circuit sub-assemblies during assembly; item 10, a top view of the electronic Flex circuit sub-assembly; item 11 a plurality of electronic interconnections shown within dashed lines, and item 12, mechanical connections that relieve strain on the electrical interconnections (11).

FIG. 2 shows the top view of a Flex circuit sub-assembly (10A) with a plurality of components that are mounted on the Flex circuit, these components are shown within a box (9): the box with dashed lines. Alignment holes (8A) are used to align Flexible circuit sub-assemblies when they are assembled into a layered Flex circuit assembly. A plurality of pads where electronic interconnections will be made during the assembly of the Flexible circuit assembly are shown within the boxes with dashed lines that are numbered (11A).

FIG. 3 shows the top view of a layered Flex circuit assembly (10B): i.e.: Flex circuit sub-assemblies have been electrically and mechanically connected together. Note that this assembly consists of the same Flex circuit sub-assembly that is depicted in FIG. 2 containing electronic components (9), yet here the alignment holes (8B) and electronic interconnection pads (11B) have changed, the black color here is used to indicate that electrical interconnections (11B) and mechanical interconnections (8B) have been made. Thus alignment holes may be used for two purposes: aligning Flex circuit sub-assemblies during manufacture of a layered Flex circuit assembly and mechanically connecting Flex circuit sub-assemblies such with the intent of strain relieving electrical connections within the layered electronic Flex circuit assembly. Straps (12) are also depicted as another form of mechanical interconnection that may be used to mechanically strain relieve electronic interconnections that connect different layers of Flex circuit sub-assemblies that are contained within the layered electronic Flex circuit assembly.

FIG. 4 shows a layered Flex circuit electronic assembly (14) that is manufactured within a case (13) that uses a liquid (15) and a gas (16) to form a liquid phase to gas phase heat pipe, where heat causes the liquid to evaporate into a gas that dissipates heat energy through the case.

FIG. 5A and FIG. 5B shows two different designs where a layered Flex circuit electronic assembly (14) (the same layered Flex circuit electronic assembly shown in FIG. 1A) is manufactured within a case (17, & 19) that uses a liquid (15) and a gas (16) to form a liquid phase to gas phase heat pipe, where heat causes the liquid to evaporate into a gas that dissipates heat energy through the case. These cases are designed with a plurality of towers (18A, & 18B) that enable the electronic assembly to be placed in any orientation without impairing the function of the heat pipe. No matter the orientation the towers surface area enables them to efficiently cool the gas causing it to condensate back into a liquid, there is always a place for the gas to migrate while the electronic components are maintained in a bath of liquid. Towers 18A and 18B towers contain chambers; When the layered Flex circuit electronic assembly (14) contained within the heat pipe case (17, & 19) is rotated liquid flows into lower chambers as gas rises into upper chambers.

FIG. 5C shows the same elements shown and described in FIG. 5A (items 14, 5, 16, & 17); items 18*ch* are towers the same as item 18A shown in FIG. 5A, yet in this figure shows the chamber contained within; the chamber is shown by the dotted lines and is contained within the tower, the tower shown in cross section. Also shown in FIG. 5C are a horizontal cross section and a vertical cross section, items 18*ch*; in this instance towers and chambers are cylindrical. Item 7B are heat conductive pads added to the flex circuit sub-assemblies.

DESCRIPTION OF THE INVENTION

In this document the terms "trace layer" and "trace layers" are used to identify a single flexible circuit that contains a number of independent signal carrying metallic layers that are encapsulated together as a single unit. Thus these terms are use to describe conventional flexible circuits.

The invention described within this document is an electronic assembly that uses multiple flexible circuits that are assembled into unique configurations with unique attributes that include: a plurality of flexible circuits with electronic components attached, where each flexible circuit is separated by substances that are designed to transfer heat away from electronic components that are located between different flexible circuits forming a "multi-layer" 3 dimensional "layered Flex circuit assembly" from a plurality of "Flex circuit sub-assemblies". Furthermore these Flex circuit sub-assemblies are designed to prevent stresses from damaging the assembly in unique ways. Thus the invention describe within is substantially different from conventional Flex circuits and conventional approaches to 3 dimensional electronic assemblies.

The invention described within this document is an electronic assembly that uses multiple flexible circuits that are assembled into unique configurations with unique attributes that include: a plurality of flexible circuits with electronic components attached, where each flexible circuit is separated by substances that are designed to transfer heat away from electronic components that are located between different flexible circuits forming a "multi-layer" 3 dimensional "layered Flex circuit assembly" from a plurality of "Flex circuit sub-assemblies". Stresses are prevented from damaging the assembly in two ways:

1. Different Flex circuit sub-assemblies are free to move relative to the layer below, or above in the vicinity where electronic components are located; The different Flex circuits act as flexible bridges that contain electronic components:

2. Electrical interconnections between layers of Flex circuit sub-assemblies are strain relieved by mechanical restraints by simply clipping, clamping, or gluing them together. Thus the invention describe within is substantially different from conventional Flex circuits or conventional 3 dimensional electronic assemblies.

Thus a new form of sub-assembly/micro-module packaging is proposed: Electronic components assembled onto layered flex circuits and assembled into sub-assemblies that are themselves interconnected in ways that are flexible where flexibility prevents stresses from damaging components and are restrained in other areas to strain relieve electrical interconnections that connect metallic traces between Flex circuit sub-assemblies. Furthermore various forms of cooling mechanisms may be used to transfer heat from electronic components contained between layers of flex circuits that are built in ways that are consistent with this invention.

This invention is an article of manufacture that consists of a plurality of discrete separate Flex circuit sub-assemblies, where each Flex circuit sub-assembly may have electronic components attached, soldered, or bonded to it in a way that forms an electric/electronic circuit, or part of an electronic/electric circuit. Each Flex circuit sub-assembly is designed to be aligned and electrically connected, soldered, or bonded with at least one other Flex circuit sub-assembly such that electrical connections can be made between them forming a three dimensional electronic assembly. Connecting the Flex circuit sub-assemblies mechanically in a way that prevents the electrical connections between them from being pulled apart is also incorporated into the design. Furthermore areas between each Flex circuit layer will be used to transfer heat away from electronic components that are between Flex circuit layers through using various forms of heat transfer technologies.

Thus multiple layers of Flex circuit sub-assemblies that are mechanically and electrically attached form a 3 dimensional electronic assembly with embedded components and embedded cooling that is made of a plurality of Flex circuits. Solder pads, or metallic pads that may be used to connect circuit traces together between layers of Flex circuits after they have been assembled into Flex circuit sub-assemblies, and approach that transcends conventional Flex circuits. These circuits may also be attached through pins or wires, soldered or bonded to the metallic pads or solder pads, yet the preferred embodiment is to bond them together using small metallic pads or vias. At least two of these layers will contain electronic components (integrated circuits, active devices, or passive devices) that generate heat.

This technique resolves limitations encountered by simply folding flex circuits in certain specific and non-obvious ways that include:

1. Reduced Flex Circuit Scrap Costs:
   The layered flex circuit described within contains a series of separate Flex circuits; each individual flex circuit contains traces for only a portion of the assembly. Whereas if a circuit with similar functionality were built using folded Flex circuits, a single Flex circuit would contain the entire circuit in a sheet. In the case of the folded Flex circuit design a single defect in the Flex circuit could cause the entire sheet of Flex circuit to be scrapped. Since the layered Flex circuit uses a plurality of small flex circuit, a single defect would cause only a small amount of Flex circuit material to be scrapped. Defects in Flex circuits are measured in terms of defects per surface area of flexible circuit material, given this a plurality of small Flex circuits will yield a lower scrap rate of flexible circuit material that is proportional to the surface area of the flexible circuit.

2. Minimized Trace Lengths:
   The layered Flex circuit approach described within minimizes trace lengths as components in this approach can be routed directly to a component below it as compared to routing a signal through a sheet.

3. Fewer Trace Layers are Required is Something that Yields Several Non-Obvious Benefits:
   The layered Flex circuit described within can minimize the number of trace layers per discrete separate Flex circuit layers to accomplish the same circuit as compared to a folded Flex circuit design. This is because the 3 dimensional structure of the layered Flex circuit makes signals more likely to be close to where they need to go. Also as the number of trace layers is increased so does the likelihood that a give Flex circuit will contain a defect.

Furthermore the layered Flex circuit approach is not susceptible to cracking traces as is the folded flex circuit. Folding a Flex circuit stresses traces that are bent when the Flex circuit is folded, and this stress can cause these bent traces to crack. The more layers contained within folded Flex circuits increases stiffness of the Flex circuit; as stiffness increases so does the difficulty of folding and the force/pressure require to fold the Flex circuit. Folding a thick Flex circuits stresses the circuit's traces more then folding a thin Flex circuit. Thus traces contained within a thick Flex circuit are more susceptible to cracking than those contained within a thinner Flex circuit. Since the layered flex circuit approach does not rely on folding the Flex circuit the layered flex circuit does not suffer from this disadvantage.

4. The layered Flex circuit design described within have heat transfer mechanisms designed in from the beginning. Folded Flex circuits will trap heat as Mylar is a thermal insulator; heat is the enemy of electronic components and causes them to fail more rapidly.

Heat will be transferred away from the electronic components through various mechanisms, depending on the specific implementation. Heat transfer mechanisms such as: forced or directed airflow: heat sinks: fluid cooling: phase change materials: heat pipe: an enclosure for the electronic assembly that is designed to operate as a heat pipe, or other heat transfer mechanisms may be used to build and electronic assembly consistent with this invention.

The three dimensional layered Flex circuit electronic assembly can also be sealed, they may be (predominantly) filled with fluid for cooling, or could include heat sinks that are built into the sub-assemblies (carbon, phase change materials, aluminum, or other materials are available). Directed airflow or liquid flow can also be used for cooling.

The total number of circuit trace layers in this layered approach=(number of trace layers per flex layer) * (number of flex layers). In the case where each flex layer contains 2 trace layers contains 2, then the total number of trace layers=2 * (the number of flex layers). Here if the number of flex layers is 3, the total number of trace layers=6.

One potential process would include mounting components on the top of each layer through standard flex circuit assembly processes. Individual flex circuits could be aligned by using a series of alignment holes in the flex circuits that align a plurality of solder pads, then traces that interconnect layers could be bonded together forming an electronic assembly where components are located between layers of flex circuits. See FIGS. 1, 2, & 3. Note: The number, size, and placement of alignment holes can be adjusted to yield required dimensional accuracies. Standard semiconductor wire bonding equipment combined with specially shaped bonding interconnects (solder pads, holes, or edge fingers) could be used to facilitate ease of manufacture.

Such a layered flex circuit sub-assembly could then be built into a package forming an integrated component (multi-chip module) that could be used within other designs, and be assembled onto conventional electronic assemblies.

Fluid Filled or Partially Fluid Filled Electronic Sub-Assemblies/Micro-Modules:

Electronic sub-assemblies/micro-modules can be filled with fluid or predominantly filled with fluid. Electronics have been immersed in engineering fluids for years to cool electronics.

Engineering fluids for cooling electronics are available from 3M, each with different evaporation temperatures. A variety of different circuits, each with its own temperature characteristics could be engineered using this approach.

Low power devices do not generate much heat and therefore should not require rapid heat transfer capabilities. In such a case the fluid could stay in a liquid phase throughout its temperature requirements.

Higher power devices do generate heat and would likely require rapid heat transfer capabilities. In such a case a liquid phase to gas phase heat pipe could be designed within the case of the layered Flex circuit electronic assembly. Heat pipes require a fluid to evaporate (into a gas), the gas migrates to a cooler area where it condenses (into a liquid), and the resulting liquid flows back, rains down, or wicks over to start the process again.

One unique design aspect incorporated into this invention is a case that surrounds the layered Flex circuit assembly that is designed to operate as a liquid phase to gas phase heat pipe; where the case of the electronic assembly itself is a liquid phase to gas phase heat pipe. Furthermore the liquid and the case would be made of materials that will not contaminate the encased electronic assembly with ions. This is an important non-obvious benefit of the design.

Typically liquid phase to vapor phase heat pipes are not designed to encase electronic devices, they are mounted in proximity to or touching the case of electronic devices, frequently they added to designs after the electronic design is nearly complete, and are often viewed as a solution to a design gone awry. Furthermore these types of heat pipes use metal and liquids such as water that can freely exchange ions with other metallic surfaces: If these types of heat pipes were used to encase an electronic component or assembly, ionic contamination would cause oxidation, corrosion, and metallic deposition that would attack metallic surfaces and contacts within the electronic assembly causing opens and/or shorts that would ultimately cause the assembly to fail.

Other cooling mechanisms that may be used are directed airflow and the directed flow of a liquid. Simply direct air or liquid between the layered flex circuits and over components such that heat is transported away from the components.

Heat sinks may also be built within the assembly to transfer heat away from components. Heat sinks are may be fabricated from various materials: copper, aluminum, graphite, phase change material, and other technologies as required. Heat sinks made of various materials are available for purchase, or custom heat sinks may be designed and ordered for build.

The invention claimed is:

1. An electronic assembly comprising:
   a) a plurality of electronic flexible circuit sub-assemblies made of a plurality of flexible circuits with electronic components mounted on each said flexible circuit; said flexible circuit sub-assemblies further comprising holes that align said flexible circuit sub-assemblies when making electrical connections between the each said flexible circuit sub-assembly; and
   b) an enclosure that contains said plurality of electronic flexible circuit sub-assemblies made of said plurality of flexible circuits with electronic components mounted on each said flexible circuit, wherein some portion of liquid, and some portion of gas are contained within said enclosure; said enclosure further comprising a plurality of predominantly hollow towers extending in a plurality of different directions in three dimensional space, each of said towers containing at least one chamber.

2. The electronic assembly of claim 1 further comprising heat conductive pads around the electronic components and between each of said flexible circuits.

3. An electronic assembly comprising:
   a) a plurality of electronic flexible circuit subassemblies made of a plurality of flexible circuits with electronic components mounted on each said flexible circuit; said flexible circuit sub-assemblies further comprising holes that align said flexible circuit sub-assemblies when making electrical connections between each said flexible circuit sub-assembly, said flexible circuit sub-assemblies are also mechanically connected to each other;
   b) heat conductive pads separating each said flexible circuit sub-assembly with electronic components mounted on each said flexible circuit; said heat conductive pads contacting said electronic components and between each said flexible circuit sub-assembly; and
   c) a case that predominantly contains said plurality of electronic flexible circuit sub-assemblies made of said plurality of flexible circuits with electronic components mounted on each said flexible circuit, said case not comprising liquid fill.

4. The electronic component assembly of claim 3 further comprising a plurality of heat pipes embedded into said plurality of flexible circuits with electronic components mounted on each said flexible circuits; said heat pipes oriented in a plurality of different directions in three dimensional space.

* * * * *